United States Patent [19]

Dukes et al.

[11] Patent Number: 4,658,225
[45] Date of Patent: Apr. 14, 1987

[54] AMPLITUDE INSENSITIVE DELAY LINES IN A TRANSVERSAL FILTER

[75] Inventors: John N. Dukes, Los Altos Hills; Richard A. Baumgartner, Palo Alto, both of Calif.

[73] Assignee: Hewlett-Packard Company, Palo Alto, Calif.

[21] Appl. No.: 628,066

[22] Filed: Jul. 5, 1984

[51] Int. Cl.⁴ .................. H03H 17/06; H03H 15/00; H03C 1/36
[52] U.S. Cl. .................................. 333/166; 333/165; 332/9 R; 332/9 T; 332/52
[58] Field of Search ............. 333/165, 166, 16 T; 307/510, 513, 518, 520, 529; 332/9 R, 9 T, 10, 11 R, 11 D, 14, 31 R, 31 T, 52; 329/104–109, 145; 364/724–727, 825–827

[56] References Cited

U.S. PATENT DOCUMENTS

| 2,980,871 | 4/1961 | Cox ................................. 333/166 X |
| 3,474,260 | 10/1969 | Frobach ........................... 333/166 |
| 3,521,170 | 7/1970 | Leuthold et al. ................ 333/165 X |
| 3,760,280 | 9/1973 | Covington ....................... 328/56 X |
| 3,973,138 | 8/1976 | Puckette et al. ................ 357/24 X |
| 4,124,820 | 11/1978 | Arnstein ......................... 328/55 X |
| 4,255,676 | 3/1981 | Berger et al. .................... 307/513 |
| 4,524,424 | 6/1985 | White .............................. 333/166 X |

OTHER PUBLICATIONS

Travis–"Data Converters", EDN, Jun. 14, 1984; pp. 119 and 121–124.
Jonathan Taft, "A Digital Delay Line, Implemented in VLSI", Abstract of talk given at MIT in Mar./Apr., 1983.
Heinz E. Kallmann, "Transversal Filters", Proceedings of the I.R.E., Jul. 1940, pp. 302–310.
Joseph F. Lutz, Synchronous Relay-Line Detector Provides Wideband Performance, Microwaves & RF, Nov. 1982, 71, 74, 75, 79.
H. Edward Karrer & Arthur M. Dickey, "Ultrasound Imaging: An Overview", Hewlett-Packard Journal, Oct. 1983, pp. 3–6.
Phillip K. Hardage and Stephen W. Peurifoy, "Method and Apparatus for Delaying A Pulse", Ser. No. 352,671, filed 2/26/82, abandoned U.S. Patent Application, Attorney Docket No. 1590.

Primary Examiner—Marvin L. Nussbaum
Attorney, Agent, or Firm—Douglas L. Weller

[57] ABSTRACT

A transversal filter is provided which includes a delay circuit comprising a plurality of cascaded saturating circuit elements. The delay circuit has a series of taps from which signals with varying delays are obtained. The obtained signals are combined to form filtered signal(s).

10 Claims, 39 Drawing Figures

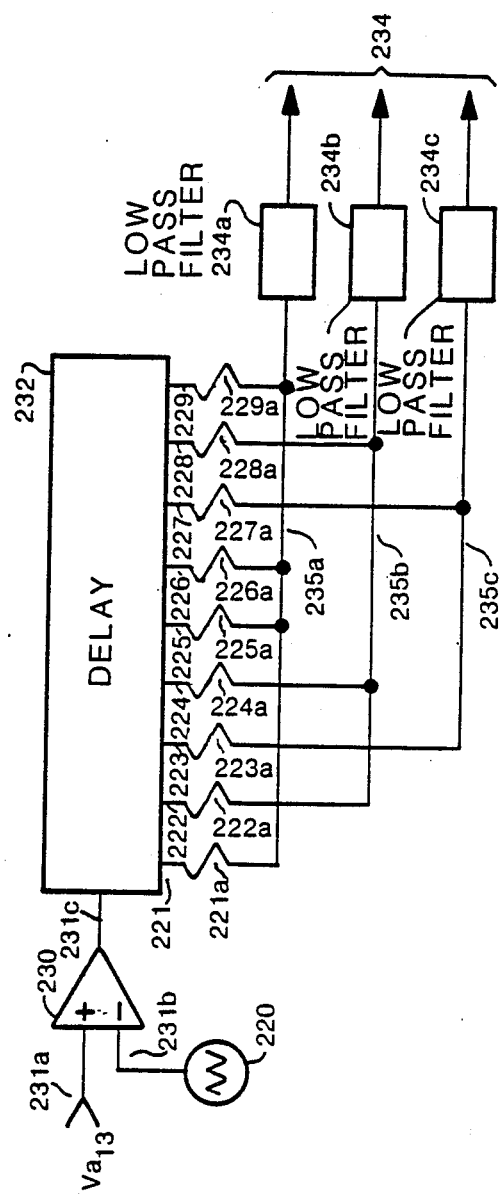

AMPLITUDE INSENSITIVE DELAY LINES IN A TRANSVERSAL FILTER

BACKGROUND OF THE INVENTION

Analog signal processing applications often require the use of signal delay lines. Such delay lines can be categorized generally as either analog or digital in nature. A typical example of an analog delay line is that disclosed by Puckette et al. in U.S. Pat. No. 3,973,138 issued Aug. 3, 1976 which uses a bucket brigade of serially connected capacitors to provide a desired amount of time delay. Such analog delay lines are unfortunately relatively expensive, require the use of analog switches, and tend to suffer from crosstalk problems. In addition, either when used singly or when cascaded, such analog systems invariably reduce the bandwidth of the signal being processed.

A typical digital delay line is disclosed by Covington in U.S. Pat. No. 3,760,280 issued Sept. 18, 1973, in which a single analog signal channel is converted to a frequency modulated (FM) signal which in turn is delayed by means of a clocked digital shift register. The resulting delayed digital signal is then demodulated to provided a delayed analog signal. Such a digital delay system overcomes many of the problems of analog delay lines, but the bandwidth problem still remains. Since the digital signal is propagated through the shift register by means of a clock signal, it is necessary to use a very high speed shift register and clock to maintain the overall system bandwidth. Thus, according to conventional sampling signal theory, in order for the delayed output signal to have a 5 megahertz (MHz) information bandwidth with a 0.1% pulse width resolution, the shift register must be clocked at or above 10 gigahertz (GHz) (i.e., 5 MHz×1000×2).

Other workers such as Arnstein in U.S. Pat. No. 4,124,820 issued Nov. 7, 1978 have shown digital delay lines which do not make use of a clocked shift register, but instead achieve their desired delay function by applying an FM signal to a plurality of conventional digital gates arranged in cascade along with latch connected logic gates to reconstitute the FM pulses travelling through the delay circuit. Propagation delay is then adjusted by adding external timing capacitance or resistance to compensate for device variations. Although such an asynchronous delay line does not make use of a clock as in Covington, the resulting output signal is still bandwidth limited due to the low bandwidth of the individual digital gates, the use of latches to overcome propagation losses, and the use of resistors and capacitors to adjust the propagation delay.

SUMMARY OF THE INVENTION

In accordance with the preferred embodiments of the present invention, a delay circuit is presented for providing signal delay. In order to delay an analog signal, the analog signal is first represented by a binary signal with only two voltage states (a logic 1 and a logic 0). For example, this can be done by using the analog signal to pulse width modulate, frequency modulate or phase modulate a carrier wave to produce a modulated signal. The modulated signal can then be coupled to a plurality of cascaded saturating elements. Each saturating element provides an incremental delay. Delay across the delay circuit can be varied by providing a digital switching means which allows selection of the number of circuit elements through which the binary signal travels, by varying the period of delay through each element, or by a combination of the above two methods. After passing through the delay circuit the binary signal can then be restored by demodulation to the initial analog signal, without loss of bandwidth.

The delay circuit for providing signal delay may be incorporated in many types of devices. For instance, the delay circuit may be incorporated in a transversal filter to replace more conventional analog delays, in a wideband FM detector to provide phase shift, or in a phased array acoustic imaging system to align signals from array elements.

BRIEF DESCRIPTION OF THE DRAWINGS

FIGS. 13A and 13B are block diagrams of a transversal filter in accordance with a preferred embodiment of the present invention.

DESCRIPTION OF THE PREFERRED EMBODIMENT

Delay of a binary signal may be accomplished by coupling the signal through a series of saturating elements. What is meant by a binary signal is a signal which changes between two voltage levels. The voltage levels, commonly referred to as logic 0 and logic 1 may be, for example, 0 volts and 3 volts.

Figure 1:
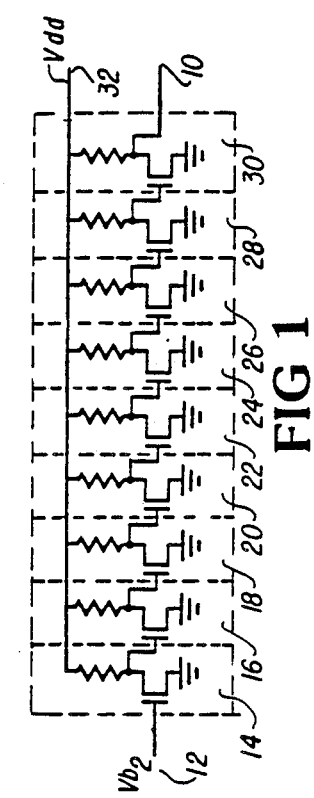
FIG. 1 is a schematic diagram of cascaded inverters in accordance with a preferred embodiment of the present invention.

In FIG. 1, a binary signal ($Vb_1$) is applied to an input 12 of a plurality of cascaded saturating circuit elements, in this case inverters 14, 16, 18, 20, 22, 24, 26, 28, and 30. A supply voltage (Vdd), for example 3 volts, is coupled to the system at a node 32. In the preferred embodiment, each of the plurality of cascaded inverters has a propagation (or delay) time t of a few (e.g. 3–20) nanoseconds. At an output 10, the delay of the binary signal is equal to the number of inverters multiplied by the propagation time through each inverter. In the circuit of FIG. 1, this equals 9t.

Figure 2:
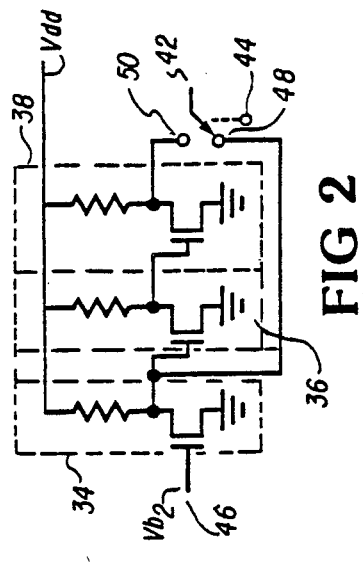
FIG. 2 shows a circuit which uses a switch to vary propagation time through the circuit.

In FIG. 2, a binary signal ($Vb_2$) is coupled at an input 46 to a plurality of cascaded inverters 34, 36, and 38. An output 42 is coupled to a node 50 or a node 48. A single-pole-double-throw switch 44 or its logic equivalent toggles output 42 between node 50 and node 48, and thus varies the duration of delay from input 46 to output 42. For example, if each of the cascaded inverters has a propagation time t, the delay when output 42 is coupled to node 48 is t and the delay when output 42 is coupled to node 50 is 3t.

Figure 3:
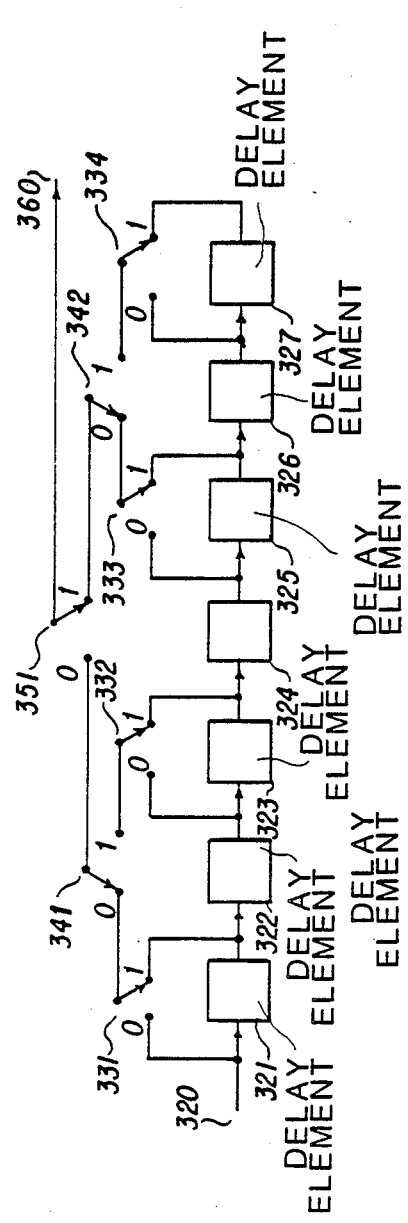
FIG. 3 shows a circuit which varies propagation delay from an input to an output by means of switches organized in the form of a binary tree.

In FIG. 3, an example is shown of a means to vary delay propagation by digital switching utilizing a binary tree. A binary signal is coupled at an input 320 to a plurality of delay elements 321, 322, 323, 324, 325, 326, and 327, typically groups of cascaded inverters as in FIGS. 1 and 2. Typically, when fabricated on a single integrated circuit, delay time T will be the same for each delay element group 321–327. A series of logic switches 331, 332, 333, 334, 341, 342, and 351, which are typically single-pole-double-throw switches or their logic equivalent, are arranged in the form of a binary tree to select a propagation time through the entire circuit. Depending upon the position of switches 331–334, 341–342, and 351, the range of propagation delay from input 320 to an output 360 is 0T to 7T. In the circuit of FIG. 3 there are 3 levels of switches: switch 351 forms the first level; switches 341 and 342 form the second level; and switches 331, 332, 333, and 334 form the third order level. The switches at each level, for convenience, may be switched together. For instance, as shown in FIG. 3, third level switches 331, 332, 333, and 334 are each selecting a pole labeled "1".

In the embodiment shown in FIG. 3 each level of switches represents a bit in a binary number Level 1 is the most significant bit, level 2 is the next most significant bit, and level 3 is the least significant bit, e.g., in FIG. 3 level 1 switch 351 is set at "1", level 2 switches 341–342 are set at "0", and level 3 switches 331–334 are set at "1", so that the current delay is $101_{base\ 2}$ times T, that is 5T.

Figure 4:
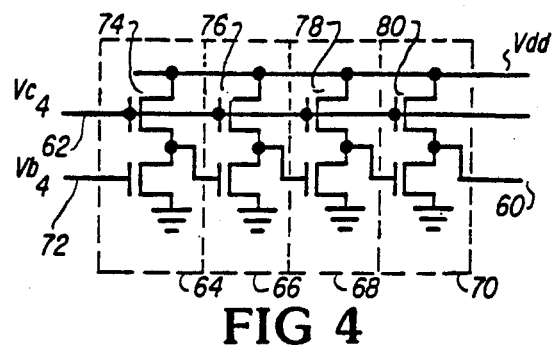
FIG. 4 shows a circuit which varies propagation delay by means of an analog signal.

In FIG. 4, an alternative method to vary delay is illustrated. A binary signal ($Vb_4$) is coupled at an input 72 to a plurality of saturating elements, 64, 66, 68, and 70, typically cascaded inverters, as shown. Variable resistors 74, 76, 78, and 80, for example depletion-type metal-oxide-silicon field effect transistors (MOSFETS), are controlled by a voltage ($Vc_4$) applied to an input 62 and function as variable current sources. Although delay time t varies as $Vc_4$ varies, typically, when $Vc_4$ is held constant, delay time t will be the same for each saturating element 64, 66, 68, and 70, when saturating elements 64, 66, 68, and 70 are fabricated on a single integrated circuit. Delay from input 72 to output 60, therefore, is always 4t. When $Vc_4$ is decreased, resistance across each of variable resistors 74, 76, 78, and 80 increases, decreasing current through variable resistors 74, 76, 78, and 80 and thereby increasing the propagation (delay) time t of each of the saturating elements 64, 66, 68, and 70. Correspondingly, as $Vc_4$ is decreased, propagation time t decreases. Therefore, varying $Vc_4$ varies the delay from input 72 to output 60.

Figure 5A:
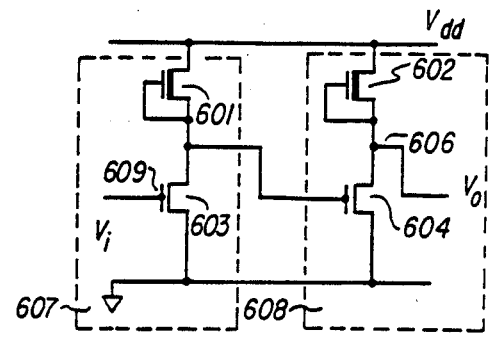
FIGS. 5A–5B show the coupling of two inverters to form a delay stage.

FIGS. 5A–5E illustrate the coupling of two inverters on an integrated circuit. FIG. 5A shows a circuit where an inverter 607, comprising an enhancement-type MOSFET 603 and a depletion-type MOSFET 601, is coupled as shown to an inverter 608, comprising an enhancement-type MOSFET 604 and a depletion-type MOSFET 602. MOSFETs 601 and 602 act as load resistances for inverters 607 and 608. An input node 609 is coupled to an output node of a prior inverter. An output node 606 is coupled to an input of a subsequent inverter. As can be seen from FIG. 5A, signal Vo on output 606 is the same as a voltage Vi on input 609 after a propagation delay through inverter 607 and a propagation dely through inverter 608. On this circuit experimental results showed a ratio of rise to fall time to be at least 3:1. What is meant by rise time is the time it takes for signal Vo to rise from logic 0 to logic 1 after signal Vo starts to rise from logic 0 to logic 1. What is meant by fall time is the time it takes for signal Vo to fall from logic 1 to logic 0 after signal Vo starts its fall from logic 1 to logic 0. The asymmetry in rise to fall times makes it difficult to propagate high frequency pulse trains through a string of inverters, coupled as in the circuit in FIG. 5A, without distortion of the timing between pulses.

Figure 5B:
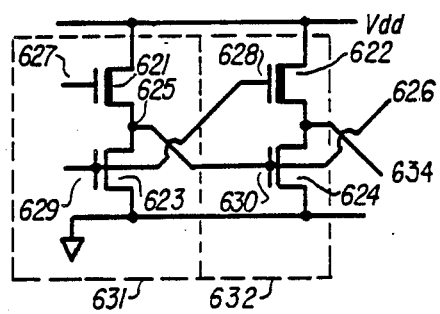

In FIG. 5B an inverter 631, comprising an enhancement-type MOSFET 623 and a depletion-type MOSFET 621, is coupled as shown to an inverter 632, comprising an enhancement-type MOSFET 624 and a depletion-type MOSFET 622. MOSFETs 621 and 622 act as variable load resistances. An input node 629 and an input node 627 are coupled to output nodes of a prior inverter. An output node 626 and an output node 634 are coupled to inputs of a subsequent inverter. As shown in FIG. 5B, input 629 is coupled to MOSFET 623, and is also coupled to a gate 628 of MOSFET 622. Similarly a node 625 of inverter 631 is coupled to MOSFET 624 at a gate 630, and is also coupled to output node 626. The rise to fall ratio from input 629 to output 634 for the circuit of FIG. 5B was found to be about 1.5:1. This characteristic makes the circuit in FIG. 5B better qualified than the circuit in FIG. 5A to propagate high frequency pulse trains.

Figure 5C:
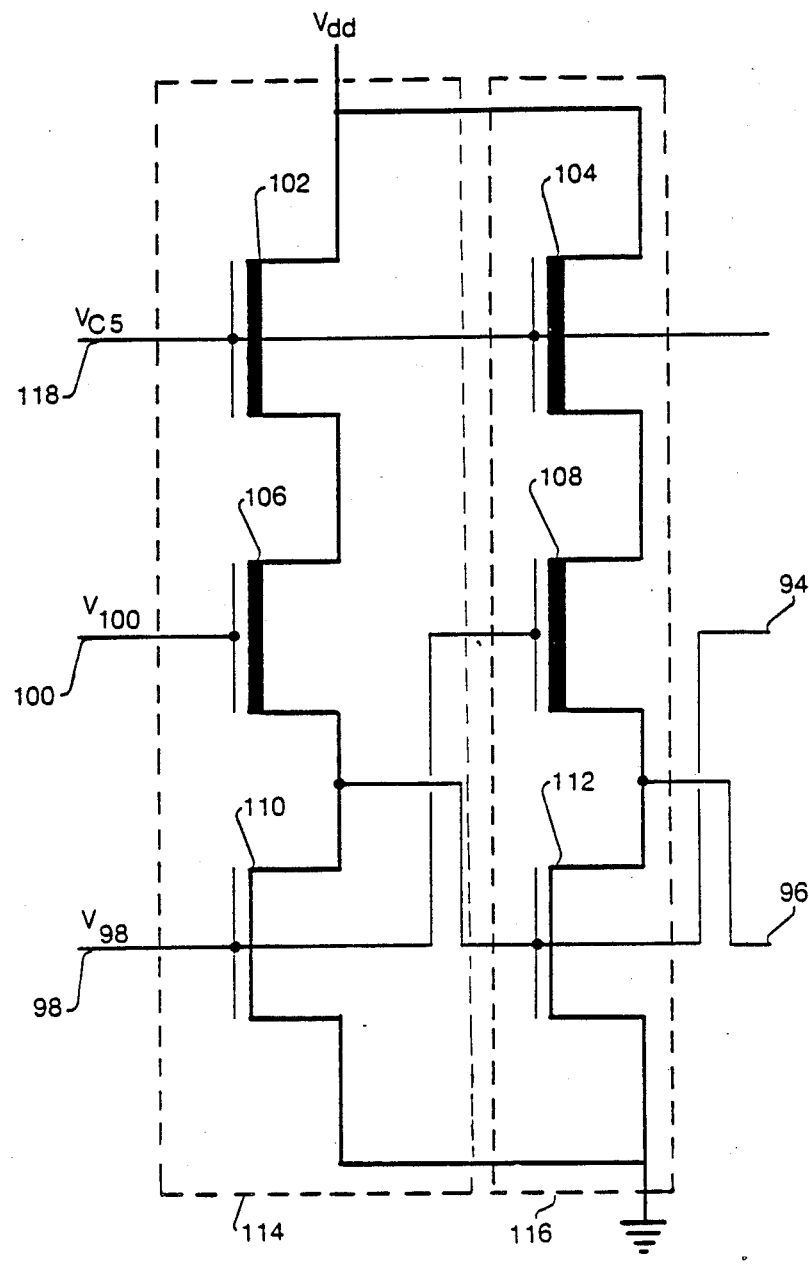
FIGS. 5C–5E show the coupling of two inverters to form a delay stage in accordance with preferred embodiments of the present invention.

FIG. 5C shows a circuit where two inverters, 114 and 116 are coupled. Varying a voltage $V_{c5}$ applied to an input 118 varies resistance across a depletion-type MOSFET 102 and a depletion-type MOSFET 104 which both function as variable current sources. An input node 98 and an input node 100 are coupled to outputs nodes of a prior inverter. A voltage $V_{100}$ on input node 100 is an inverse of a voltage $v_{98}$ on input node 98, i.e., when $v_{98}$ is at logic 1, then $V_{100}$ is logic 0, and vice-versa. A depletion-type MOSFET 106 and an enhancement-type MOSFET 110 of inverter 114, are coupled as shown to a depletion-type MOSFET 108 and an enhancement-type MOSFET 112 of inverter 116. An output node 94 and an output node 96 are then available to be coupled to a succeeding inverter.

The major difference between the circuit in FIG. 5B and the circuit in FIG. 5C is the addition of MOSFETs 102 and 104. These MOSFETs were added in inverters 114 and 116, and similar MOSFETs may be added to every inverter in a series of cascaded inverters, to vary the delay time across each inverter by controlling the current through the inverters. This capacity to vary delay time can be used to standardize propagation time between integrated circuits. Propagation time through integrated circuits may vary because of process variations in the process used to fabricate the integrated circuit. Process variations may include variations in doping density for depletion mode load devices, variations in gate geometries for small geometry devices, and environmental variations, such as variations in temperature.

Figure 5D:
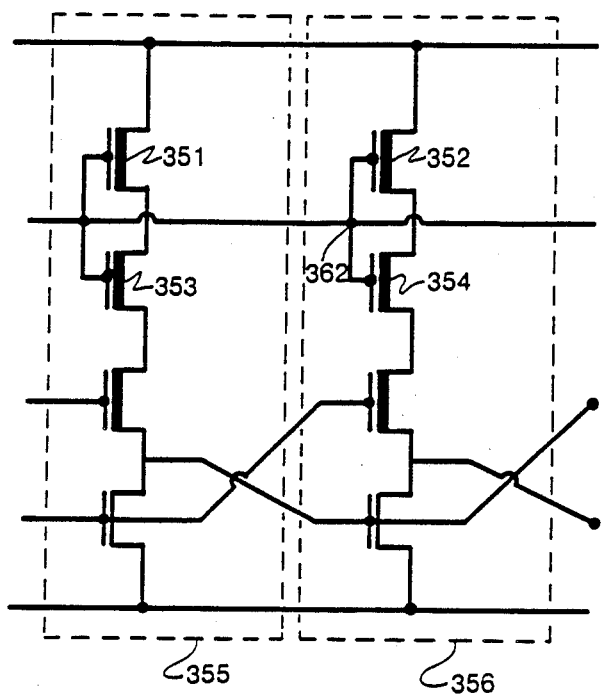
Figure 5E:
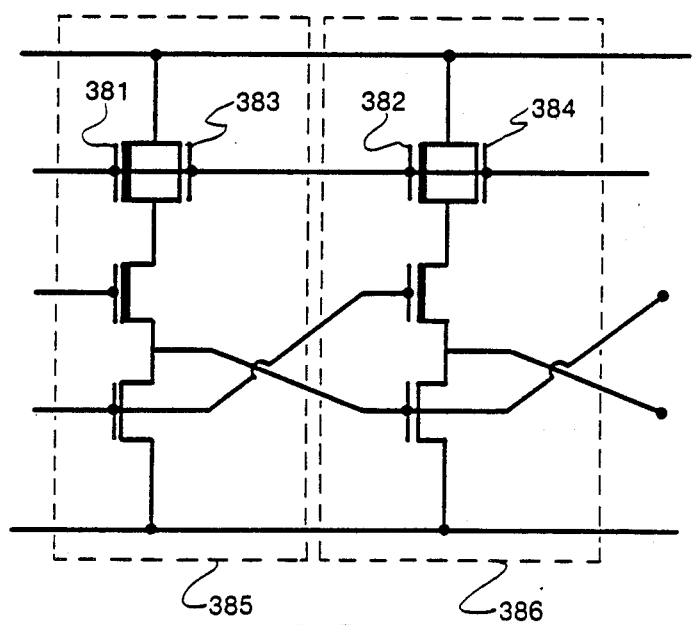

FIGS. 5D and 5E illustrate alternative embodiments for coupling inverters. These embodiments allow for compensation for for wide variation in propagation time resulting from process variations, without impingement on other inverter performance parameters. In FIG. 5D each inverter 355 and 356 has two depletion-type MOSFETS—MOSFETS 351 and 353 in inverter 355, and MOSFETs 352 and 354 in inverter 356—coupled in series to provide time delay variation through current control. In FIG. 5E each inverter 385 and 386 has one depletion-type MOSFET and one enhancement-type MOSFET—a depletion-type MOSFET 381 and an enhancement-type MOSFET 383 in inverter 385 and a depletion-type MOSFET 382 and an enhancement-type MOSFET 384 in inverter 386—coupled in parallel to provide time delay variance through current control.

Figure 6:
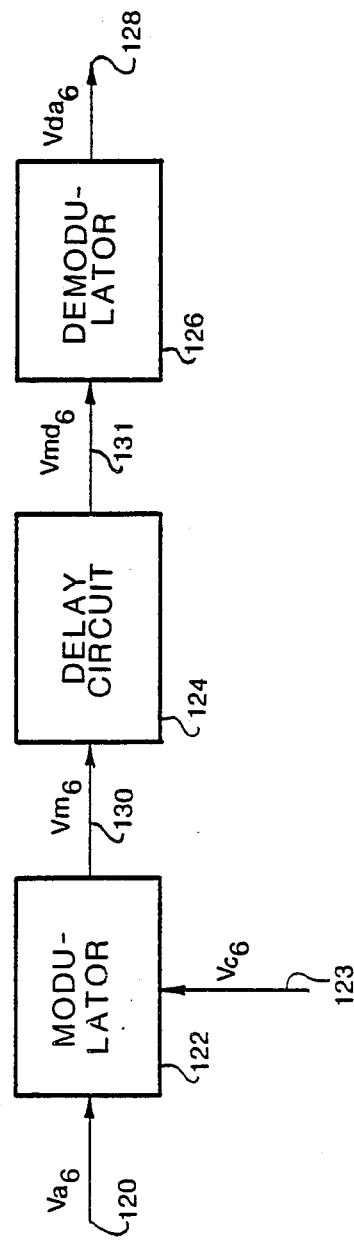
FIG. 6 is a block diagram of an analog signal delay circuit in accordance with a preferred embodiment of the present invention.

FIG. 6 is a block diagram of a circuit for delaying analog signals. An analog input signal $Va_6$ is applied to an input 120. At a modulator 122, signal $Va_6$ modulates a carrier wave $Vc_6$ applied to an input 123. Modulation may be, for example, pulse width modulation, frequency modulation, or phase modulation. A modualted signal $Vm_6$ from modulator 122 is coupled to an input 130 of a delay circuit 124. Delay circuit 124 consists of a series of saturating elements, for example cascaded inverters as discussed above. A modulated-delayed signal $Vmd_6$ output of delay circuit 124 is coupled at an input 131 to a demodulator 126. A delayed analog signal $Vda_6$ appears on an output node 128. Signal $Vda_6$ is signal $Va_6$ with a delay time determined by delay line 124.

Figure 7:
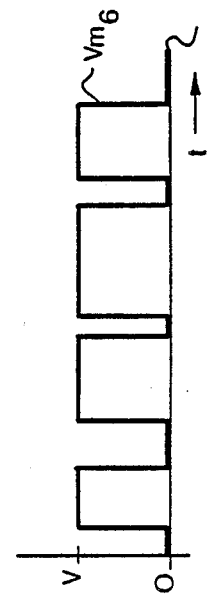
FIG. 7 shows a typical waveform of a signal at a location on the circuit of FIG. 6.

FIG. 7 shows, for a pulse width modulated system, an example of a waveform of signal $Vm_6$ at input 130 of delay circuit 124 of the circuit of FIG. 6.

Figure 8:
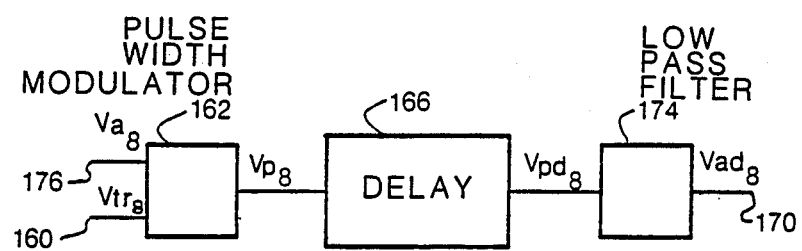
FIG. 8 is a block diagram of an analog signal delay circuit utilizing pulse width modulation.

FIG. 8 is a simplified block diagram of a delay circuit employing pulse width modulation. An analog signal $Va_8$ is applied to an input 176. A pulse width modulator 162 pulse width modulates analog signal $Va_8$ with a triangle (i.e., a back-to-back sawtooth) wave $Vtr_8$ which is on an input 160. The amplitude of triangle wave $Vtr_8$ must be larger than the maximum amplitude of analog signal $Va_8$, and the frequency of triangle wave $Vtr_8$ must be at least two times the maximum harmonic frequency of interest within analog signal $Va_8$ in order to satisfy the Nyquist sampling theorem.

The output of pulse width modulator 162, a pulse width modulated signal $Vp_8$, is coupled to a delay 166, typically comprising cascaded inverters, as discussed above. A low pass filter 174 converts a delayed pulse width modulated signal $Vpd_8$ which is from delay 166 to a delayed analog signal $Vad_8$. Signal $Vad_8$ appears on a circuit output 170. Signal $Vad_8$ is signal $Va_8$ with a delay time determined by the circuit.

Figure 8A:
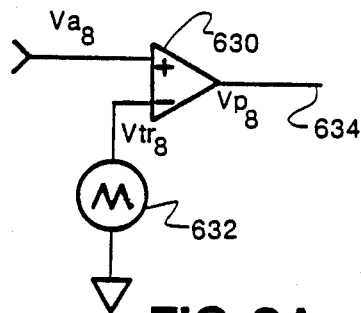
FIGS. 8A–8C show alternative designs for pulse width modulators which may be used with the analog signal delay circuit shown in FIG. 8.
Figure 8B:
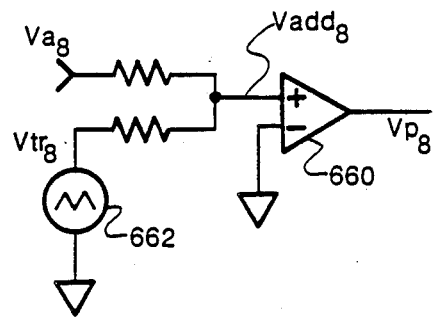
Figure 8C:
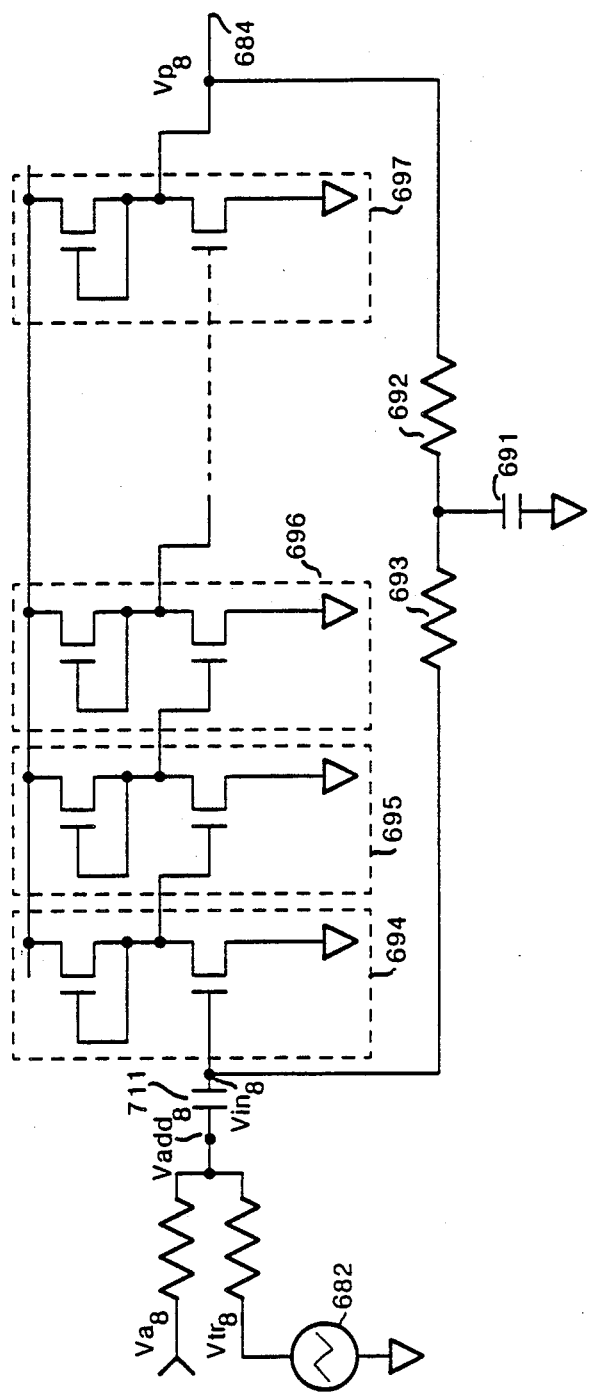

FIGS. 8A–8C show alternate designs for pulse width modulator 162 in FIG. 8. In the design in FIG. 8A, a comparator 630 compares analog signal $Va_8$ with triangle wave $Vtr_8$ generated by a triangle wave generator 632. Pulse width modulated signal $Vp_8$ appears on an output 634 of comparator 630.

In the pulse width modulator of FIG. 8B, analog signal $Va_8$ is added to triangle wave $Vtr_8$ generated by a triangle wave generator 662 to form a signal $Vadd_8$. Comparator 660 compares signal $Vadd_8$ with a fixed reference (shown as ground in FIG. 8B) to produce pulse width modulated signal $Vp_8$.

In FIG. 8C, analog signal $Va_8$ is added to triangle wave $Vtr_8$ generated by a triangle wave generator 682 to form signal $Vadd_8$. Signal $Vadd_8$ is coupled through an input capacitance 711 and becomes an input signal $Vin_8$. Signal $Vin_8$ is propagated through an odd number of cascaded inverters—represented by cascaded inverters 694–697—and appears as pulse width modulated signal $Vp_8$ on an output 684. Typically, 21 cascaded inverters would be a sufficient number of inverters for the modulator of FIG. 8C.

An input resistance 693, an output resistance 692 and a capacitance 691 serve as a feedback circuit. The feedback circuit constrains the dc component of signal $Vin_8$ to be at the threshold voltage of the first inverter, inverter 694. Therefore, oscillations in signal $Vin_8$ are centered at the threshold voltage of inverter 694. When the dc component of signal $Vin_8$ is below the threshold voltage of inverter 694, then the duty cycle of $Vp_8$ will increase, thus increasing the charge on capacitance 691, and raising the dc component of signal $Vin_8$. Similarly when the dc component of signal $Vin_8$ is above the threshold voltage of inverter 694, then the duty cycle of signal $Vp_8$ will decrease, thus decreasing the charge on capacitance 691 and lowering the dc component of signal $Vin_8$.

Figure 8D:
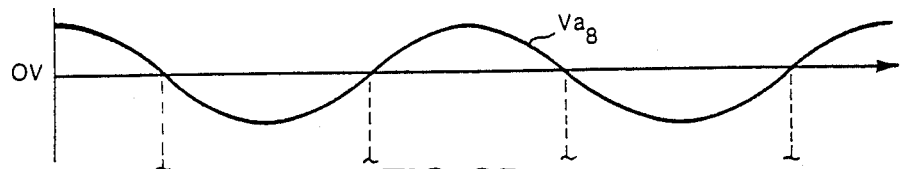
FIGS. 8D–8D''' show timing diagrams for voltage signals in comparators shown in FIGS. 8A–8C.
Figure 8D:
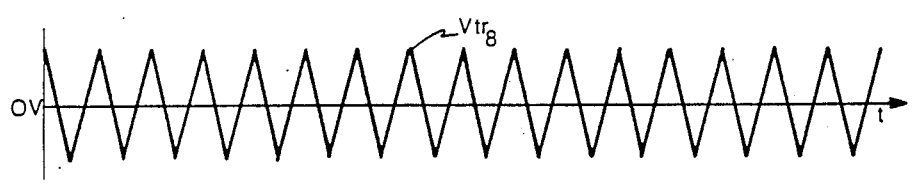
Figure 8D:
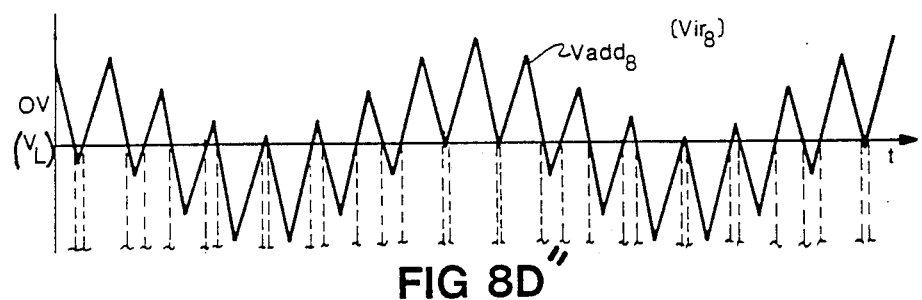
Figure 8D:
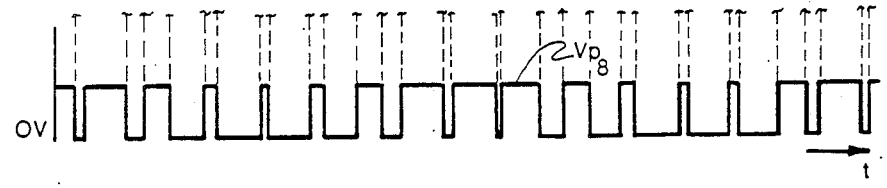

FIG. 8D is a timing diagram (not drawn to scale) of signals $Va_8$, $Vtr_8$, $Vadd_8$, and $Vp_8$. Signal $Vin_8$ has the same waveform as signal $Vadd_8$ except that the dc component of signal $Vin_8$, represented by a reference signal $Vi$, is at the threshold voltage of inverter 691, while for the waveforms shown, the dc component of signal $Vadd_8$ is zero volts.

Figure 9A:
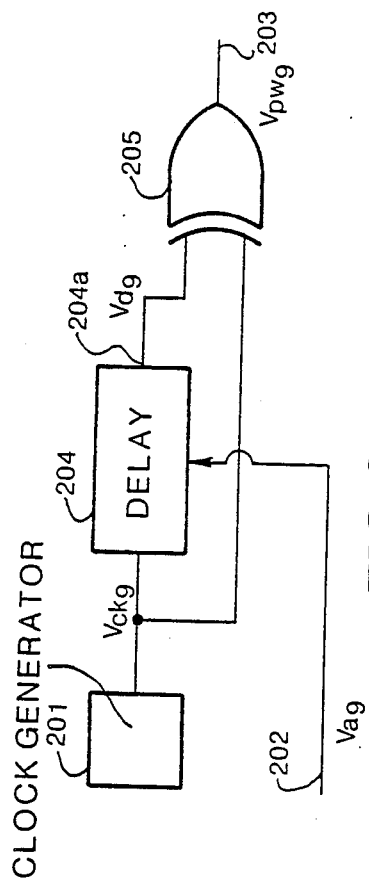
FIG. 9A shows another design for a pulse width modulator.

FIG. 9A shows another design for a pulse width modulation circuit. A clock generator 201 generates a series of clock pulses $Vck_9$, typically at a frequency of 16 MHz. A Boolean logic gate 205 performs an "Exclusive Or" (XOR) between clock pulses $Vck_9$ proceeding directly from clock generator 201, and a series of pulses $Vd_9$ which have been propagated through a delay 204. Logic gate 205 could be replaced by other logic gates—for instance, an "AND" gate, or an "OR" gate or by various types of "FLIP-FLOPS"—which have an output signal with a duty cycle which varies according to the relative phase between two input signals. Typically delay 204 comprises cascaded inverters, as discussed above. An analog signal $Va_9$ is applied to an input 202 of delay 204. Analog signal $Va_9$ varies propagation delay of the clock pulses $Vck_9$ through delay 204 as explained in the discussion of the circuit in FIG. 5C. Typically, when analog signal $Va_9$ is 3.0 volts, delay 204 will perform a 90° phase shift on series of clock pulses $Vd_9$, e.g. a delay of approximately 16 nanoseconds when the clock frequency is 16 MHz.

Figure 9B:
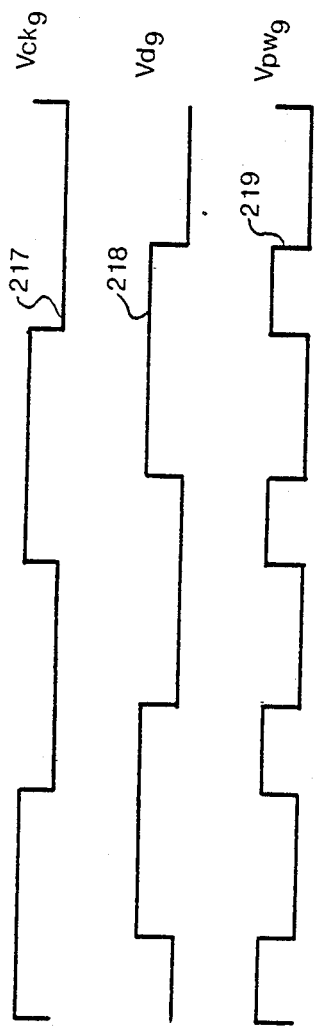
FIG. 9B shows a timing diagram of signals from the pulse width modulator shown in FIG. 9A.

In FIG. 9B, a timing diagram for the circuit in FIG. 9A is shown. A waveform 217 represents clock pulses $Vck_9$ generated by clock generator 201. A waveform 218 represents delayed pulses $Vd_9$ at an output 204a of delay 204 after a 90° phase shift. A waveform 219 represents a pulse width modulated signal $Vpw_9$ at an output 203 of logic gate 205. When delay 204 performs a 90° phase shift, pulse width modulated signal $Vpw_9$ is a square wave with a duty cycle of 50% and a frequency equal to twice the frequency of clock pulses $Vck_9$. Increasing the time delay through delay 204 increases the duty cycle of pulse width modulated signal $Vpw_9$. Decreasing the time delay through delay 204 decreases the duty cycle of pulse width modulated signal $Vpw_9$. Thus, analog signal $Va_9$ at input 202 of delay 204 effectively pulse width modulates clock pulses $Vck_9$, by varying the position of the trailing edges of clock pulses $Vck_9$ with respect to the rising edges of clock pulses of clock pulses $Vck_9$.

Figure 9C:
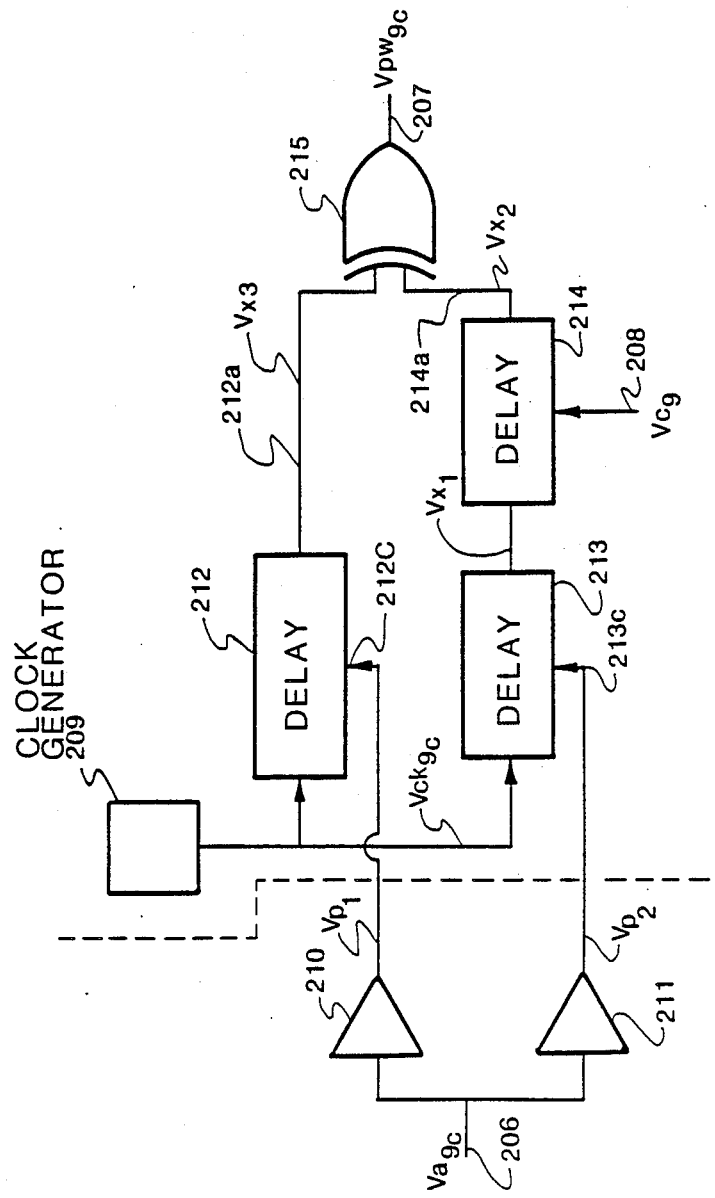
FIG. 9C shows an alternative design for a pulse width modulator.

In FIG. 9C, another design for a pulse width modulator is shown. A clock generator 209 generates a series of clock pulses $Vck_{9c}$, typically at a frequency of 16 MHz. Clock pulses $Vck_{9c}$ are coupled through a delay 212 and a delay 213. Delays 212 and 213 typically are identical and comprise cascaded inverters, as discussed above. An analog signal $Va_{9c}$ is applied to an input 206 of the circuit. Analog signal $Va_{9c}$ is split into differential voltage drives. For instance, an amplifier 210 inputs analog signal $Va_{9c}$ and outputs a first output signal $Vp_1$ comprising analog signal $Va_{9c}$ summed with a DC bias voltage, while an inverting amplifier 211 inputs analog signal $Va_{9c}$ and outputs a second output signal $Vp_2$ comprising analog signal $Va_{9c}$ inverted and summed with a DC bias voltage.

First output signal $Vp_1$ is coupled to delay 212 at a control input 212c and second output signal $Vp_2$ is coupled to delay 213 at a control input 213c. Output signals $Vp_1$ and $Vp_2$ vary propagation delay of clock pulses $Vck_{9c}$ through delays 212 and 213. A delay 214 provides an additional 90° phase shift on output of delay 213, e.g., a delay of approximately 16 nanoseconds when the clock frequency is 16 MHz. A correction signal $Vc_9$ may be applied to an input 208 of delay 214 to vary propagation through delay 214 for IC process compensation.

A signal $Vx_3$ on an output 212a of delay 212 and a signal $Vx_2$ on an output 214a of delay 214 are coupled through a logic gate 215 to an output 207. Logic gate 215 performs an XOR between the outputs of delays 212 and 214. Logic gate 215 could be replaced by other logic gates—for instance, an "AND" gate, or an "OR" gate or by various types of "FLIP-FLOPS"—which have an output signal with a duty cycle which varies according to the relative phase between two input signals. The result of the XOR on output 207 is a pulse width modulated signal $Vpw_{9c}$ which is symmetrically modulated on both edges. A signal $Vx_1$ is shown between delays 213 and 214.

Figure 9D:
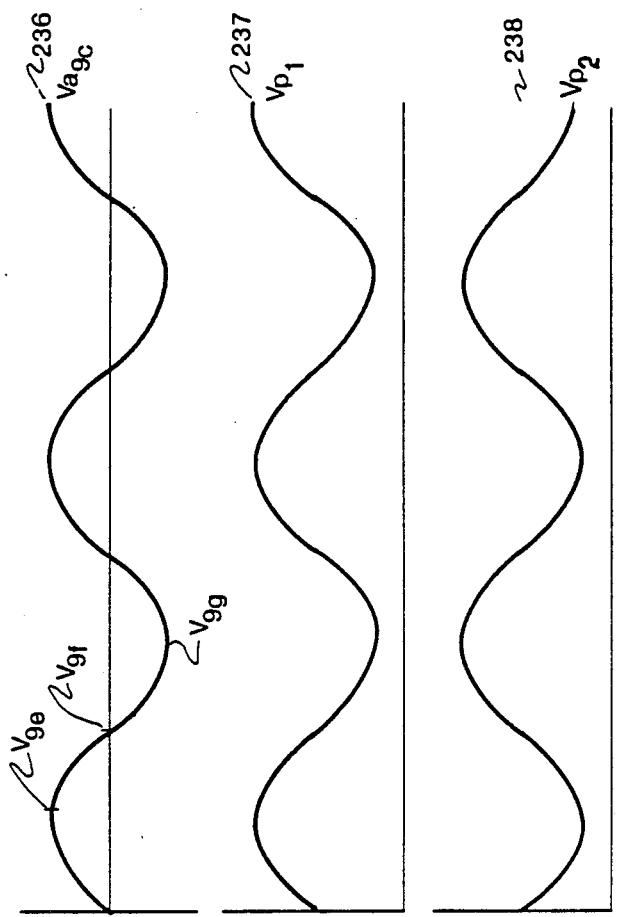
FIGS. 9D–9G are timing diagrams of signals from the pulse width modulator shown in FIG. 9C.

In FIG. 9D, a timing diagram for the circuit inputs is given. A waveform 236 represents analog signal $Va_{9c}$. A waveform 237 represents first output signal $Vp_1$. A waveform 238 represents second output signal $Vp_2$. Voltage values $V_{9e}$, $V_{9f}$ and $V_{9g}$ of signal $Va_{9c}$ are shown.

Figure 9E:
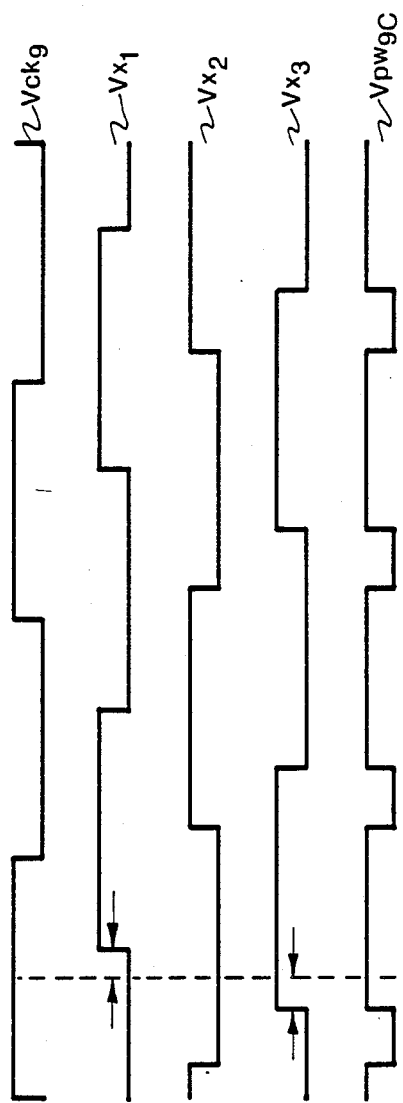
Figure 9F:
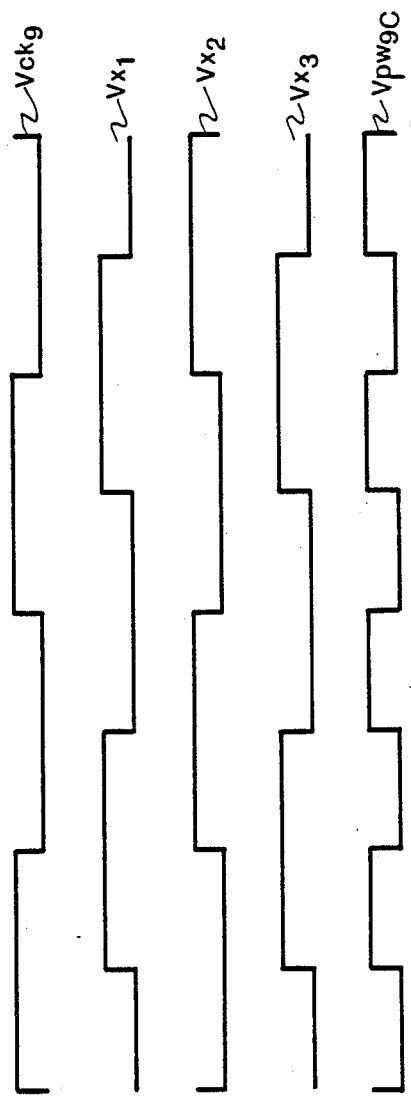
Figure 9G:
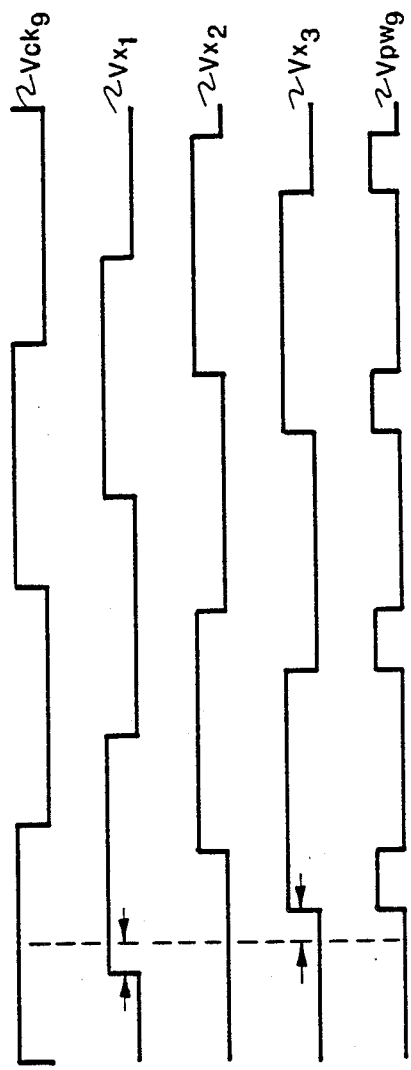

FIG. 9E shows a timing diagram of signals $Vck_9$, $Vx_1$, $Vx_2$, $Vx_3$, and $Vpw_{9c}$ when analog signal $Va_{9c}$ is at voltage value $V_{9e}$. FIG. 9F shows a timing diagram of signals $Vck_9$, $Vx_1$, $Vx_2$, $Vx_3$, and $Vpw_{9c}$ when analog signal $Va_{9c}$ is at voltage value $V_{9f}$. FIG. 9G shows a timing diagram of signals $Vck_9$, $Vx_1$, $Vx_2$, $Vx_3$, and $Vpw_{9c}$ when analog signal $Va_{9c}$ is at voltage value $V_{9g}$.

The circuit shown in FIG. 9C has several performance improvements over the circuit in FIG. 9A. For instance, in the circuit of FIG. 9C, both the rising edge and the falling edge of pulses may be affected by changes in signal $Va_{9c}$. In the circuit in FIG. 9A, varying the time delay of delay 204 results only in changing the falling edge of pulses in waveform 219. Because it varies both falling and rising edges of each pulse, the circuit in FIG. 9C can have the same dynamic range as the circuit in FIG. 9A when delay 212 and delay 213 have only half as many saturating elements as delay 204. This helps to cancel modulation non-linearities which may appear in signal $Va_{9c}$ as a result of being propagated through delays 212 and 213.

Figure 10:
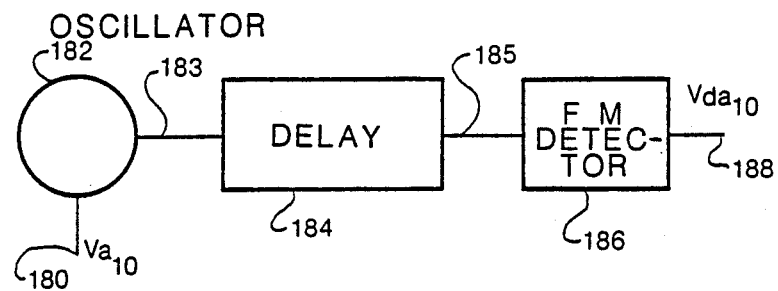
FIG. 10 is a block diagram of an analog signal delay circuit utilizing frequency modulation.

FIG. 10 is a simplified block diagram of a delay circuit employing frequency modulation. An analog signal $Va_{10}$ is applied to an input 180 of a voltage controlled oscillator 182. An output 183 of voltage controlled oscillator 182 is coupled to a delay 184, typically comprising cascaded inverters, as discussed above. An output 185 of delay 184 is coupled to an FM detector 186. A delayed analog signal $Vda_{10}$ thus appears on an output 188 of FM detector 186.

Figure 11:
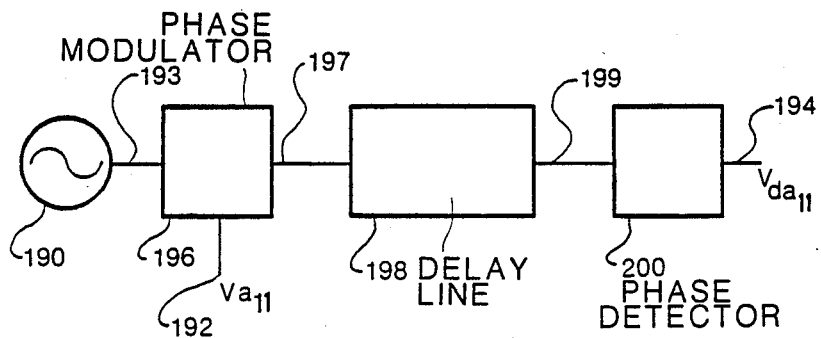
FIG. 11 is a block diagram of an analog signal delay circuit utilizing phase modulation.

FIG. 11 is a simplified block diagram of a delay circuit employing phase modulation. An analog signal $Va_{11}$ is applied to an input 192 of a phase modulator 196. Coupled to a second input 193 of phase modulator 196 is a constant frequency signal generator 190. An output 197 of phase modulator 196 is coupled to a delay line 198. Delay line 198 typically comprises cascaded inverters, as discussed above. An output 199 of delay 198 is coupled to a phase detector 200. A delayed analog signal $Vda_{11}$ appears on an output 194 of phase detector 200.

Figure 12:
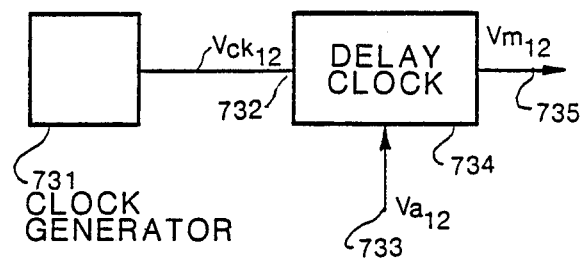
FIG. 12 shows a block diagram of a circuit which may be used for either frequency modulation or phase modulation in accordance with a preferred embodiment of the present invention.

FIG. 12 shows a block diagram of a circuit which can be used for either frequency modulation or phase shift modulation of a signal $Va_{12}$. Clock pulses $Vck_{12}$ are coupled to an input 732 of a delay circuit 734, by a clock generator 731. Typically delay 734 comprises cascaded inverters as described above. Analog signal $Va_{12}$ is coupled to an input 733 of delay 734. By the methods described above, signal $Va_{12}$ varies propagation delay through delay 734. Therefore, a frequency modulated or phase shift modulated signal $Vm_{12}$ appears on an output 735 of delay 734.

FIG. 13A shows a transversal filter embodying the present invention (For a general discussion of transversal filters and their properties see *Transversal Filters*, by Heinz E. Kallmann, Proceedings of the I.R.E., July, 1940). An analog signal $Va_{13}$ is applied to a first input 231a of a modulator, for instance a comparator 230. Coupled to a second input 231b of comparator 230 is a carrier wave generator 220. An output 231c of comparator 240 is coupled to a delay 232, typically comprising cascaded inverters as discussed above.

A series of outputs or "taps" 221, 222, 223, 224, 225, 226, 227, 228, and 229 of delay 232 are combined at summing nodes 235a, 235b, and 235c. Each tap 221-229 has associated with it a resistance 221a-229a as shown. Values for resistances 221a-229a are selected to weight signals on taps 221-229 so that when linearly combined at nodes 235a, 235b, and 235c they will have desired transversal filter characteristics. Low pass filters 234a, 234b, and 234c remove modulation carrier waves from linear combined signals at summing nodes 235a, 235b, and 235c and produce low pass filter outputs 234. As shown in FIG. 13A, use of cascaded delay elements in the implementation of transversal filters allows generation of multiple transveral filter characteristic with a minimum number of circuit elements.

Figure 13B:
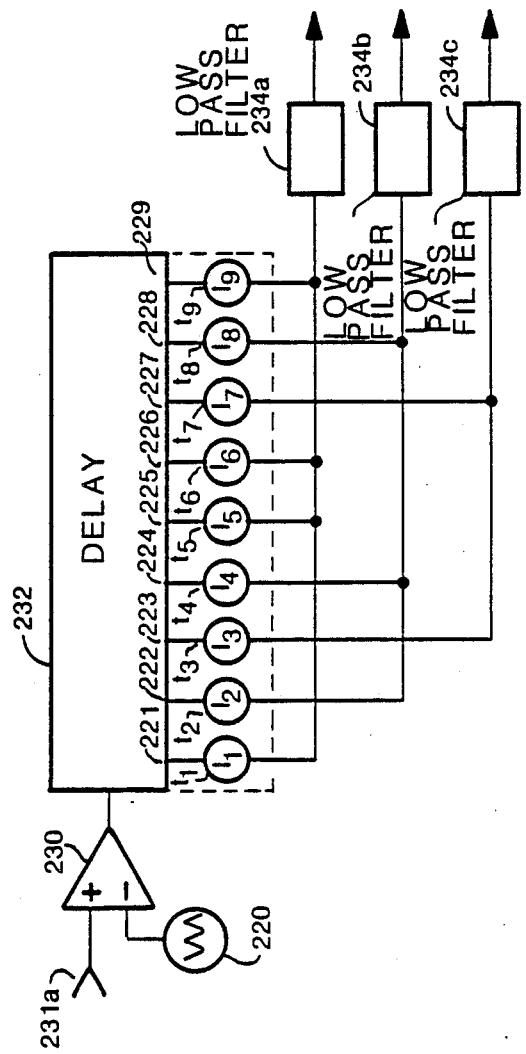

FIG. 13B shows the transversal filter of FIG. 13A where resistances 221a-229a are replaced by current sources $I_1$-$I_9$. Signals $t_1$-$t_9$ act as control input signals to current sources $I_1$-$I_9$. For instance, when $t_1$ is at logic 1, $I_1$ is "on" and when $t_1$ is at logic 0, $I_1$ is "off". Use of $I_1$-$I_9$ allows for more complete integration on the transveral filter on an integrated circuit.

Figure 14:
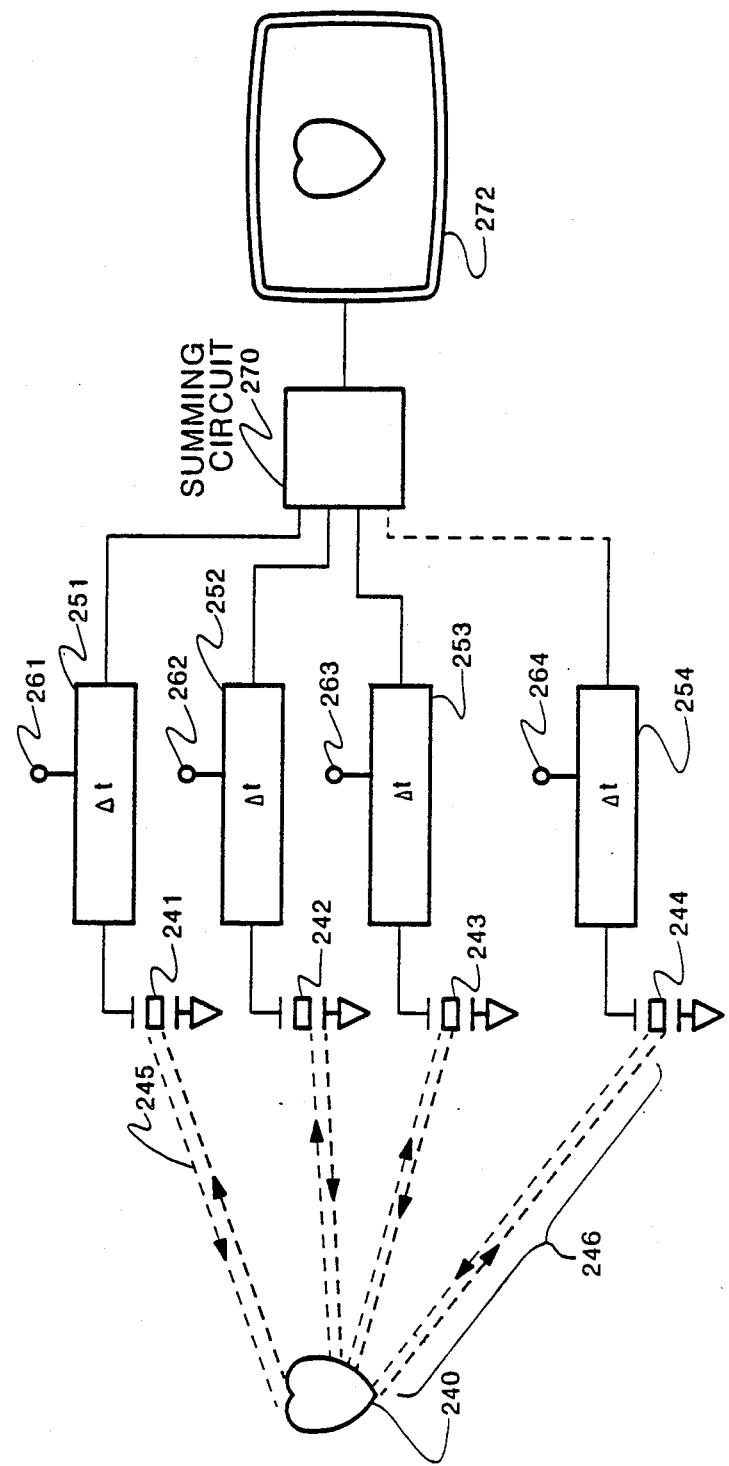
FIG. 14 is a block diagram of an acoustic imaging system in accordance with a preferred embodiment of the present invention.

FIG. 14 is a block diagram of an acoustic imaging system embodying the present invention (For a general discussion of acoustic imaging see *Ultrasound Imaging: An Overview*, by H. Edward Karrer and Arthur M. Dickey, Hewlett-Packard Journal, October 1983). A series of transducers 241, 242, 243, and 244 send outgoing ultrasound pulses 245 toward a body organ 240. Body organ 240 reflects, absorbs and/or scatters outgoing ultrasound pulses 245. Transducers 241-244 then receive incoming ultrasound pulses 246 which are the remnants of reflected and scattered outgoing ultrasound pulses 245. Transducers 241-244 transform incoming ultrasound pulses 246 to electrical signals which are coupled through receivers and modulators (shown in FIG. 14A) to a series of time delays 251, 252, 253, and 254. Each time delay 251-254 has a time delay control 261, 262, 263 and 264, associated with it. Time delay controls 261-264 can be used to vary the delay associated with each time delay 251-254. Time delays 251-254 may be circuits similar to the circuit of FIG. 5 discussed above. By varying each time delay 251-254 ultrasound pulses 246 can be combined by a summing circuit 270 to produce an image 272 of body organ 240.

Figure 14A:
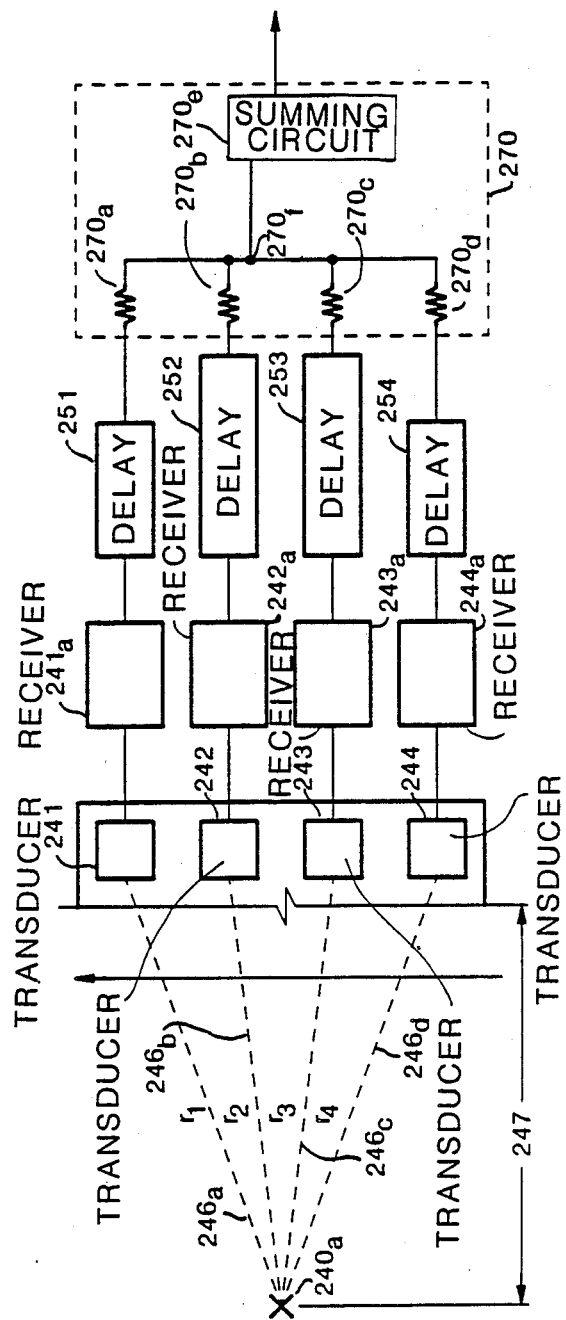
FIGS. 14A–14B shows details of delay architecture for the acoustic imaging system of FIG. 14.

FIG. 14A is a block diagram of a portion of the acoustic imaging system shown in FIG. 14. Receivers 241a-244a shown coupled between transducers 241-244 and time delays 251-254 include modulating circuits which output binary signals. Receivers 241a-244a pulse width modulate signals before coupling them to time delays 251-254. A focus point 240a on body organ 240 is a depth 247 within a human body. Incoming reflected ultrasound pulse paths 246a-246d are of varying lengths. The length of each time delay 251-254 is selected so that incoming ultrasound pulses traveling from focus point 240a to summing circuit 270 have identical delay times, acoustic plus electrical, regardless of which ultrasound pulse path 246a-246d it travels. As shown summing circuit 270 may consist of resistances 270a-270d and a low pass filter 270e. Thus pulsewidth modulated signals emerging from delay lines 251-254 are linearly combined in a resistive network (i.e. resistors 270a-270d) at a node 270f before being passed through common low pass filter 270e for demodulation.

Figure 14B:
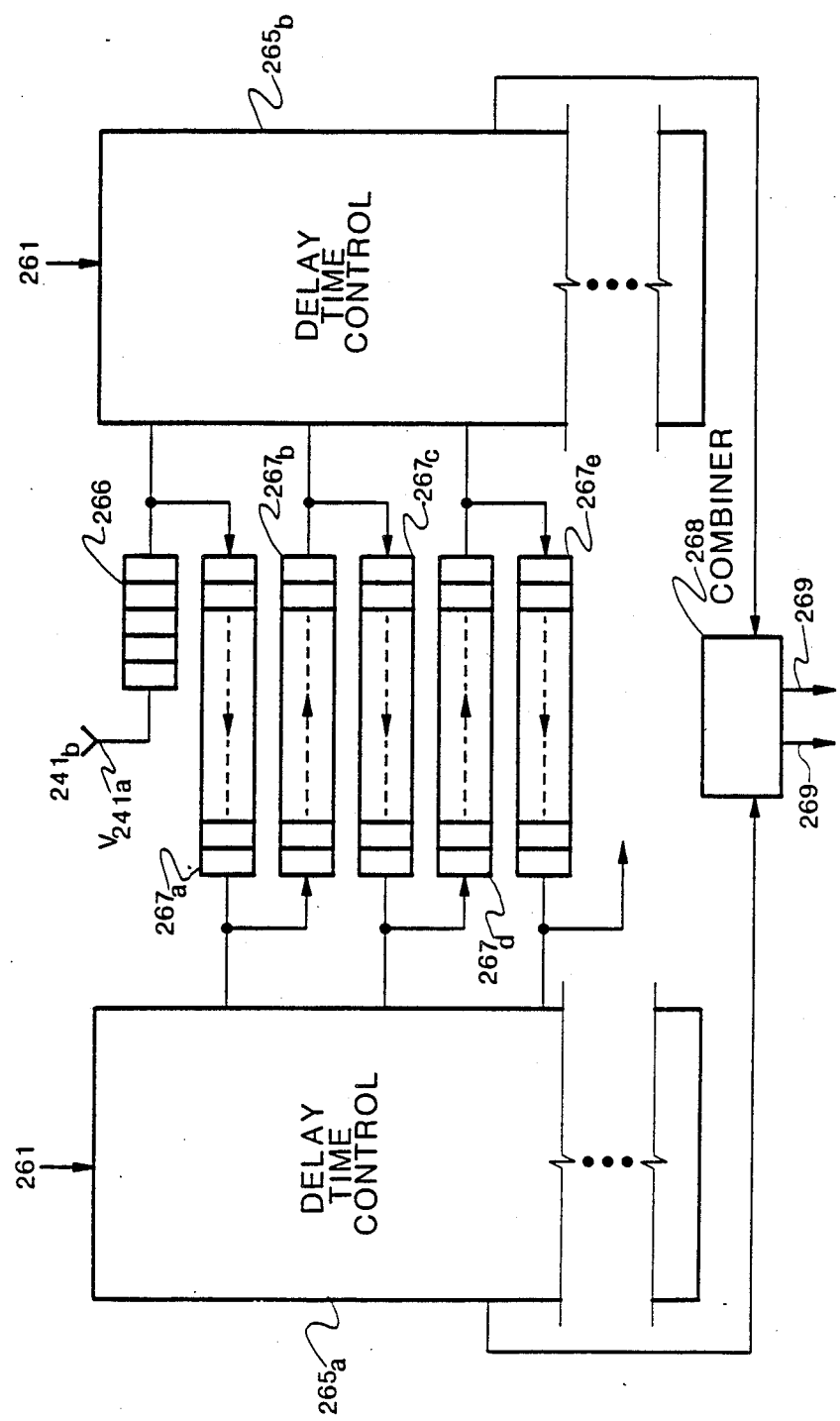

FIG. 14B shows in more detail a possible design for delay 251. Delay time control 261 is input to tap selection networks 265a and 265b. An input 241b carrying a pulse width modulated signal $V_{241a}$ from receiver 241a is coupled through delay section 266 to delay sections 267a-267e. Although only 267a-267e are shown, typically many more delay sections may be coupled in the manner shown in FIG. 14B. In this embodiment, each delay section 267a-267e includes 63 inverters and signals are delayed 62.5 ns by each delay section. Each delay section 267a-267e has an output coupled to a first of tap selection networks 265a and 265b, and an input coupled to the other of tap selection networks 265a and 265b. Delay time control 261 directs tap selection networks 265a and 265b to select one output from delay sections 267a-267e to be coupled to a combiner 268 and coupled to summing circuit 270, shown in FIG. 14A, through a combiner output 269. The delay section output selected by tap selection neworks 265a and 265b determines length of delay through delay 251. Delay through delay 251 can thus be selected by control 261 in 62.5 nanosecond increments. If smaller increments are desired, shorter delay sections with fewer inverters and/or shorter propagation time through each inverter can be designed.

Figure 15:
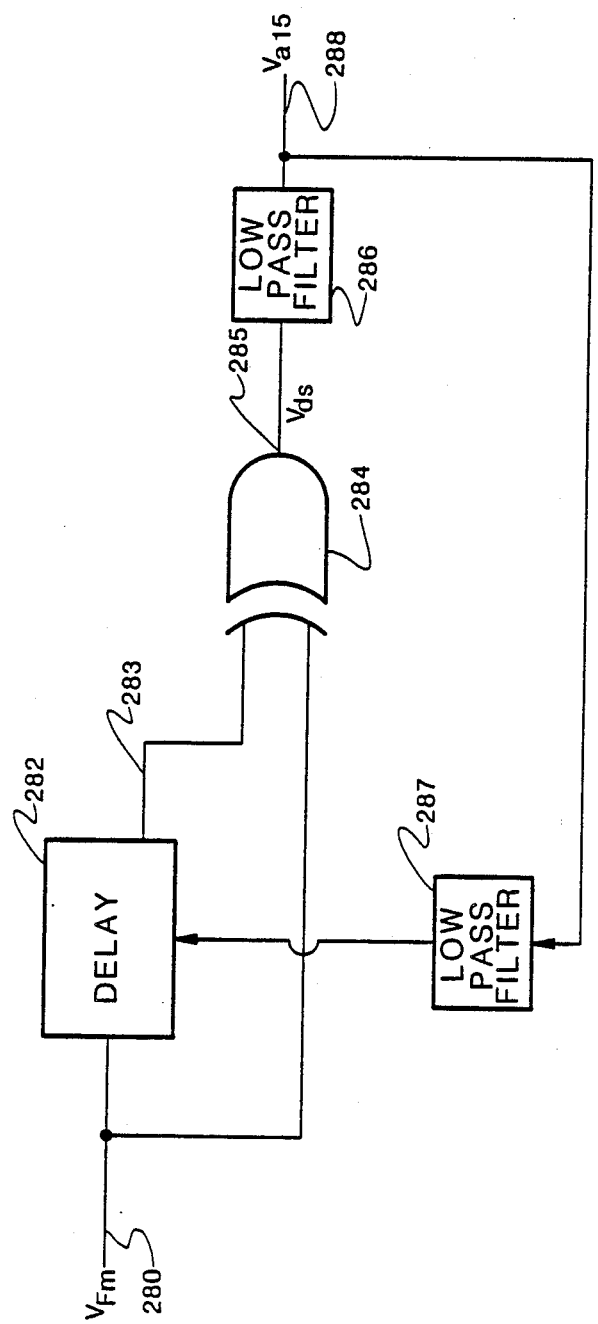
FIG. 15 is a block diagram of an FM detector in accordance with a preferred embodiment of the present invention.

FIG. 15 is a simplified block diagram of an FM detector embodying the present invention (For a general discussion of the use of delay lines in FM detectors, see *Synchronous Delay-Line Detector Provides Wideband Performance*, by Joseph F. Lutz, Microwaves & RF, November, 1982). A limited FM signal Vfm, for instance an amplitude limited FM signal with a carrier wave frequency of 10.7 MHz, is coupled to a delay 282, typically cascaded inverters as described above. Delay 282 is typically selected to perform a (n+1)90° phase shift at the carrier wave frequency (10.7 MHz). An output 283 from delay 282 and the limited FM signal Vfm are coupled through a Boolean Exclusive OR (XOR) gate 284 to a low pass filter 286. XOR gate 284 could be replaced by other logic gates—for instance, an "AND" gate, or an "OR" gate or by various types of "FLIP-FLOPS"—which have an output signal with a duty cycle which varies according to the relative phase between two input signals. A digital signal Vds at an output 285 or XOR gate 284 is essentially a pulse width modulated signal. Low pass filter 286 removes the carrier wave from pulse width modulated signal Vds and produces a demodulated analog signal $V_{a15}$. A low pass filter 287 with a cutoff frequency below the FM signal range may also be added to provide enhanced stability. Low pass filter 287 can be electrically coupled to delay 282 providing feedback to assure delay 282 continues to perform a (n+1)90° phase shift at the carrier wave frequency.

Figure 15A:
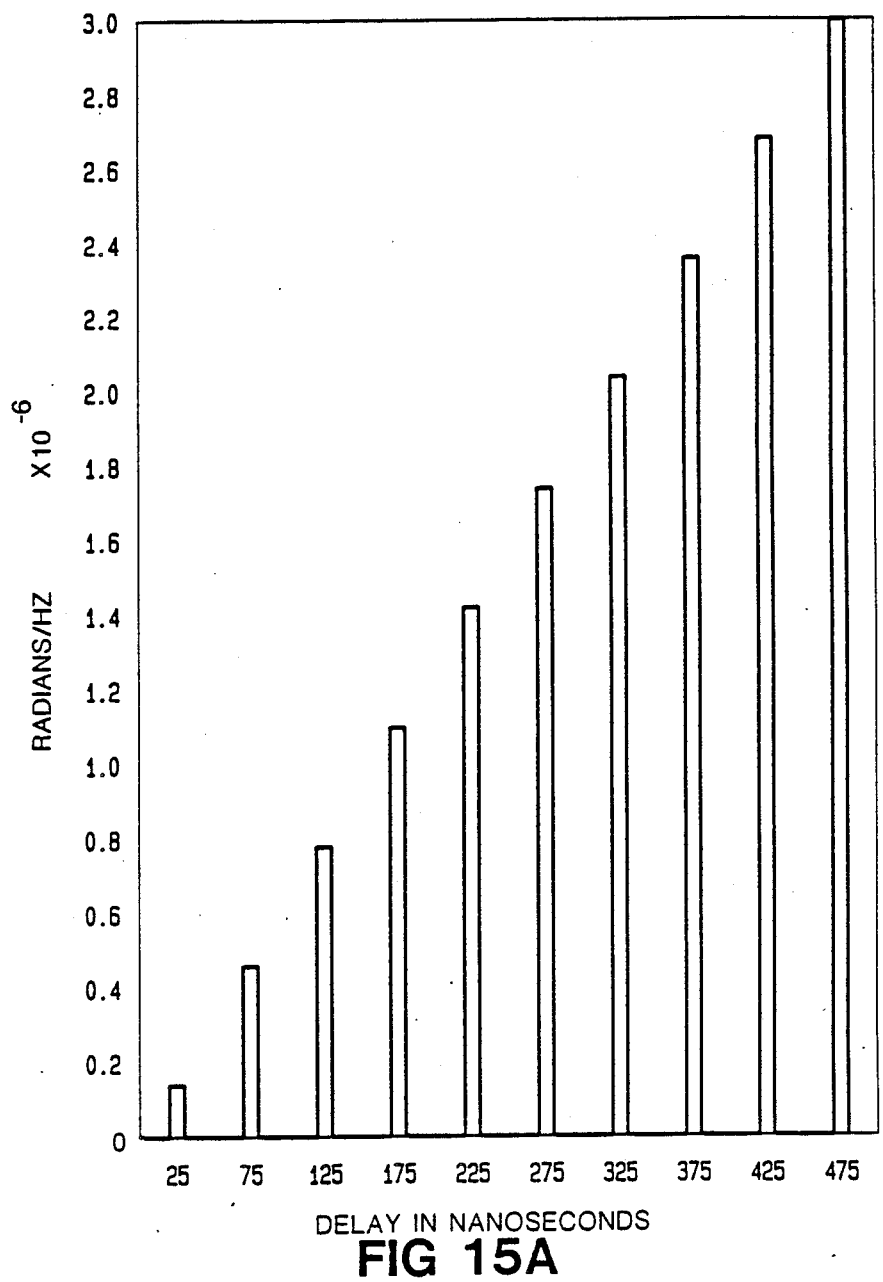
FIG. 15A is a graph showing how an increase in time delay increases the sensitivity of the detector shown in FIG. 15.

In order to perform a 90° phase shift or an odd multiple of a 90° phase shift (e.g. 90°, 450°, or 810°), delay 282 must time delay limited FM signal Vfm for the 90° phase shift or for one of its odd multiples. As the graph of FIG. 15A demonstrates, increasing the time delay to a higher multiple of a 90° phase shift increases the sensitivity of the FM detector. This effect is analogous to the increase in sensitivity with increasing Q—where Q is the figure of merit of a resonance circuit and is the ratio of reactance over resistance—for a conventional FM detector constructed from tuned circuits. The graph of FIG. 15A shows the calculation of sensitivity verses delay, where the carrier wave frequency is 10 MHz. Sensitivity in radians/hertz$\times 10^{-6}$ is on the vertical axis, while length in nanoseconds is on the horizontal axis.

Figure 16:
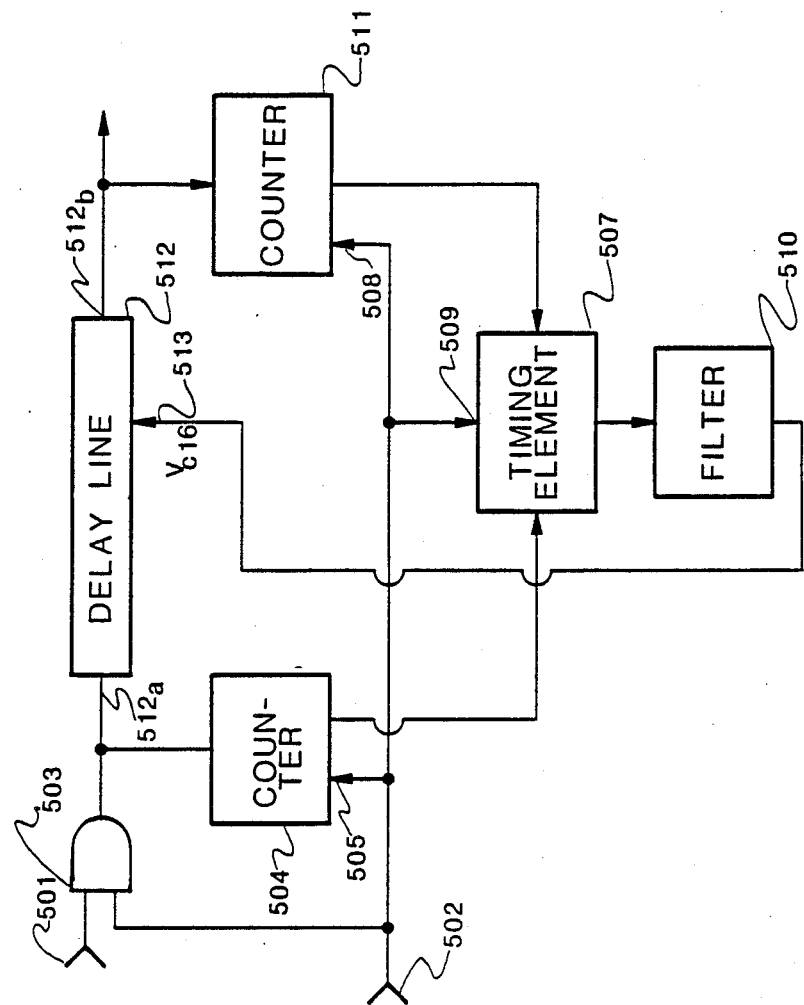
FIG. 16 is a block diagram of an apparatus for calibrating delay time through a delay circuit.

FIG. 16 is a block diagram of a circuit which calibrates a delay element to a fixed duration. Such calibration of delay elements is important for many applications, for instance, in the design of delay 251 shown in FIG. 14B.

In FIG. 16, a delay line 512, typically comprising cascaded inverters as discussed above, has a control voltage input 513. A voltage $Vc_{16}$ on input 513 is used to vary the duration of signal delay through delay line 512. A counter 504 is coupled to an input 512a of delay line 512. A counter 511 is coupled to an output 512b of delay line 512. Counters 504 and 511 are selected to provide signals which have a period greater than the maximum possible delay through delay line 512.

Outputs from counters 504 and 511 are coupled to a timing element 507. Timing element 507 is typically a comparator or a flip-flop. Timing element 507 serves to align the output from counter 504 and the output from counter 511 by comparing the outputs and coupling a signal through a filter 510 to produce signal $Vc_{16}$ on input 513 of delay line 512. Signal $Vc_{16}$ acts as feedback to delay line 513 calibrating the duration of propagation delay through delay line 512. A reset input 502 is coupled to counter 504 through a reset input 505, to counter 511 through a reset input 508, and to delay 512 through a Boolean logic "AND" gate 503.

Figure 17:
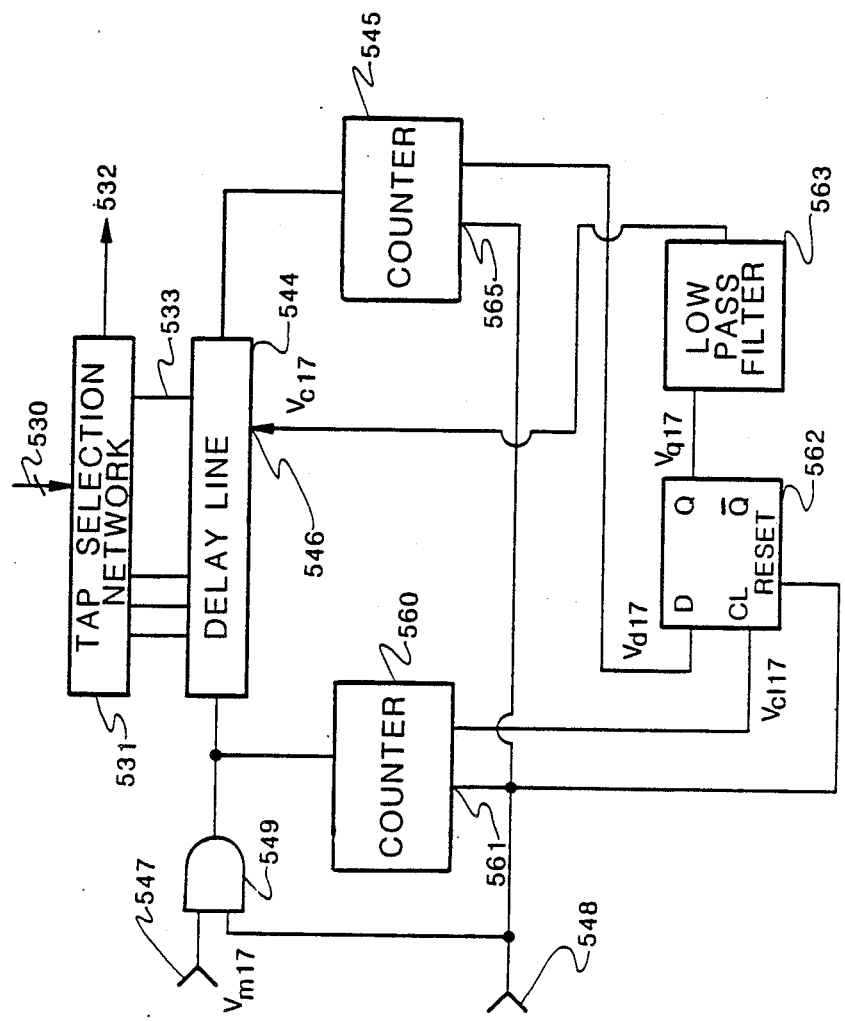
FIG. 17 shows a more detailed block diagram of the apparatus of FIG. 16 adapted for integration into delay architecture for the acoustic imaging system of FIG. 14.

In FIG. 17 an embodiment of the circuit in FIG. 16 is shown which can be used to calibrate delays 267a–267e of FIG. 14B. A 1 microsecond delay line 544 corresponds to delay line 512 of FIG. 16. Delay line 544 is coupled to a tap selection network 531 through a series of tap lines 533. Select lines 530 select which tap of series of tap lines 533 is coupled to delay output 532. When different tap lines are selected propagation delay from a system input 547 and to output 532 vary accordingly.

Divide-by-64 counters 560 and 545 respectively correspond to counters 504 and 511. A Delay (D) flip-flop 562 corresponds to timing element 507. A low pass filter 563 corresponds to filter 510. Reset inputs 548, 561, 562 and 565 correspond to reset inputs 502, 505, 509 and 508 respectively. A Boolean logic "AND" gate 549 corresponds to gate 503.

A pulse modulated 32 megahertz (MHz) signal $Vm_{17}$ is coupled to input 547 and through AND gate 549 to counter 560 and through delay line 544 to counter 545. Divide-by-64 counter 560 couples a 0.5 MHz signal $Vcl_{17}$ to a clock input CL of D flip-flop 562. Divid-by-64 counter 545 through "NOT" gate 564 couples a 0.5 MHz signal $Vd_{17}$ to a D input of D flip-flop 562. When delay line 544 is calibrated at 1 microsecond, $Vd_{17}$ and $Vcl_{17}$ will be in phase. A signal $Vq_{17}$ on a Q output of D flip-flop 562 will have a duty cycle which is used to generate a control feedback signal $Vc_{17}$.

Signal $Vq_{17}$ is coupled through low pass filter 563 to a control input 546 of delay line 544 and becomes control feedback signal $Vc_{17}$. If delay line 544 has a propagation delay longer than 1 microsecond, the duty cycle of signal $Vq_{17}$ increases, thereby increasing $Vc_{17}$ and decreasing propagation delay through delay line 544. If delay line 544 has a propagation delay shorter than 1 microsecond, the duty cycle of signal $Vq_{17}$ decreases, thereby decreasing $Vc_{17}$ and increasing propagation delay through delay line 544. Thus propagation delay through delay line is calibrated at one microsecond.

Figure 18:
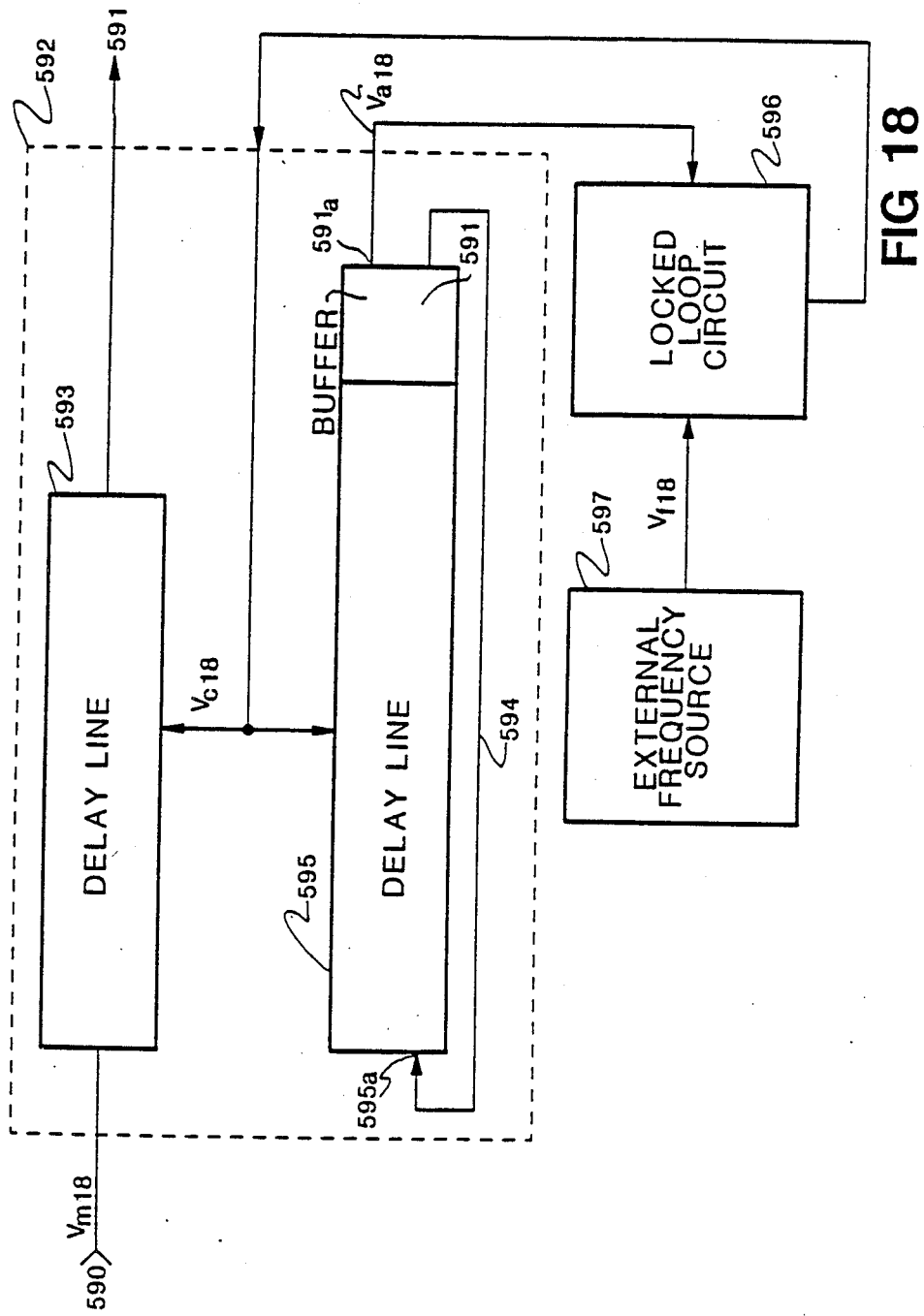
FIG. 18 shows an alternative embodiment of a calibration apparatus utilizing a ring oscillator.

FIG. 18 shows a circuit which may be used to calibrate propagation delay time from an input 590 of a delay line 593 to an output 591 of delay line 593 when an input signal $Vm_{18}$ on input 590 is intermittant or not referenced to a calibration standard. Calibration is done by utilizing tracking properties inherent within integrated circuits. A calibration delay line 595 resides on an integrated circuit 592 near delay line 593. Delay line 595 is coupled to a buffer 591 and a wire 594 which serve to electrically couple an output 591a of buffer 591 to an input 595a of delay line 595. If delay line 595 comprises an odd number of inverters, then a signal $Vo_{18}$ output 591a will oscillate at a frequency determined by the duration of signal delay through delay line 595.

A phase locked loop circuit 596 forces signal $Vo_{18}$ to oscillate at the same frequency as a signal $Vf_{18}$ generated by an external frequency source 597 by comparing the frequencies of the signals and producing a control signal $Vc_{18}$ which varies propagation delay through delay line 595 until signal $Vo_{18}$ oscillates at the same frequency as signal $Vf_{18}$. External frequency source 597 can therefore be used to select a particular frequency for signal $Vf_{18}$ and thus determine propagation delay through delay line 595. Furthermore, $Vc_{18}$ also varies signal propagation delay time through delay line 593. Because of the tracking properties of integrated circuits, determination of signal propagation delay through delay line 595 allows determination of signal propagation through delay line 593. Therefore delay line 593 may be calibrated by signal $Vf_{18}$.

What is claimed is:

1. A circuit for filtering an input signal comprising:
   a plurality of cascaded unclocked delay elements with propagation delay, the plurality of cascaded unclocked delay elements having an input, and each element in the plurality of cascaded unclocked delay elements producing an output signal which depending upon an input signal to the element settles in one of a first state and a second state, and each element havng a control means for varying propagation delay through the element, the control means including a first node coupled to a voltage source, a second node coupled to the element and a third node on which may be placed a signal in order to vary propagation delay through thc element;
   modulating means coupled to the input of the plurality of cascaded unclocked delay circuit elements for modulating a carrier wave with the input signal to produce a modulated signal, and applying the modulated signal to the input of the plurality of cascaded unclocked delay elements;
   a plurality of tap means coupled to the plurality of cascaded unclocked delay elements for tapping the plurality of cascaded unclocked delay elements wherein on each tap means there appears a corresponding delayed signal from a plurality of delayed signals; and,
   a combining means coupled to the plurality of tap means for combining the plurality of delayed signals to produce a first filtered signal.

2. A circuit as in claim 1 wherein the combining means produces a plurality of filtered signals wherein the first filtered signal is in the plurality of filtered signals.

3. A circuit as in claim 2 wherein each element of the plurality of cascaded unclocked gain elements delays the carrier signal for a length of time substantially the same as the length of time the carrier wave is delayed by every other element of the plurality of cascaded unclocked saturating gain elements.

4. A circuit for filtering an input signal comprising:
a plurality of cascaded unclocked delay elements with propagation delay, the plurality of cascaded unclocked delay elements having an input, and each element in the plurality of cascaded unclocked delay elements producing an output signal which depending upon an input signal to the element settles in one of a first state and a second state;
modulating means coupled to the input of the plurality of cascaded unclocked delay elements for modulating a carrier wave with the input signal to produce a modulated signal, and applying the modulated signal to the input of the plurality of cascaded unclocked delay elements;
a plurality of tap means coupled to the plurality of cascaded unclocked delay elements for tapping the plurality of cascaded unclocked delay elements wherein on each tap means there appears a corresponding delayed signal from a plurality of delayed signals; and,
a combining means coupled to the plurality tap means for combining the plurality of delayed signals to produce a first filtered signal, wherein the combining means comprises a plurality of resistance means for producing a resistance to current flow wherein each resistance means in the plurality of resistance means is coupled to a tap means in the plurality of tap means.

5. A circuit as in claim 4 wherein the combining means additionally comprises:
a first node at which a first combination of resistance means from the plurality of resistance means are electrically coupled together, and on which appears a first combined signal; and,
a demodulating means coupled to the first node for demodulating the first combined signal.

6. A circuit as in claim 4 wherein the combining means additionally comprises:
a plurality of nodes, each node being coupled to a combination of resistance means from the plurality of resistance means, and on each node there appears a combined signal; and,
a plurality of demodulating means for demodulating a combined signal from the plurality of combined signals, each demodulating means coupled to a mode from the plurality of nodes.

7. A circuit as in claim 6 wherein each element of the plurality of cascaded unclocked gain elements functions as an inverter.

8. A circuit as in claim 7 wherein each element of the plurality of cascaded unclocked gain elements additionally comprises:
control means for varying delay through the inverter, the control means including a first node coupled to a voltage source, a second mode coupled to the element and a third node on which may be placed a signal in order to vary delay through the element.

9. A circuit for filtering an input signal comprising:
a plurality of cascaded unclocked delay elements with propagation delay, the plurality of cascaded unclocked delay elements having an input, and each element in the plurality of cascaded unclocked delay elements producing an output signal which depending upon an input signal to the element settles in one of a first state and a second state;
modulating means coupled to the input of the plurality of cascaded unclocked delay elements for modulating a carrier wave with the input signal to produce a modulated signal, and applying the modulated signal to the input of the plurality of cascaded unclocked delay elements;
a plurality of tap means coupled to the plurality of cascaded unclocked dealy elements for tapping the plurality of cascaded unclocked delay elements wherein on each tap means there appears a corresponding delayed signal from a plurality of delayed signals; and,
a combining means coupled to the plurality of tap means for combing the plurality of delayed signals to produce a first filtered signal.

10. A circuit as in claim 9 wherein each element of the plurality of circuit elements comprises an inverter.

* * * * *